United States Patent
Ritter et al.

(10) Patent No.: US 6,979,775 B2
(45) Date of Patent: Dec. 27, 2005

(54) SECURITY APPARATUS AND METHOD

(76) Inventors: Bryan D. Ritter, 1551 Harmon Loop Rd., Homer, LA (US) 71040; Ronald G. Ritter, 111 Alexander Rd., #63, West Monroe, LA (US) 71291

( * ) Notice: Subject to any disclaimer, the term of this patent is extended or adjusted under 35 U.S.C. 154(b) by 0 days.

(21) Appl. No.: 10/887,982

(22) Filed: Jul. 9, 2004

(65) Prior Publication Data

US 2005/0016748 A1    Jan. 27, 2005

Related U.S. Application Data

(60) Provisional application No. 60/490,044, filed on Jul. 25, 2003.

(51) Int. Cl.[7] .......................................... H02G 15/113
(52) U.S. Cl. ..................... 174/40 R; 174/41; 174/43; 174/92; 70/57; 70/57.1; 439/133
(58) Field of Search ..................... 174/40 CC, 40 R, 174/40 TD, 41, 43, 44, 45 R, 45 TD, 52.1, 174/91, 92; 70/57, 57.1, 62, 63, 159; 439/133, 439/142, 144

(56) References Cited

U.S. PATENT DOCUMENTS

| | | | | |
|---|---|---|---|---|
| 2,464,565 A | * | 3/1949 | Evans et al. ............... | 174/40 R |
| 2,891,101 A | * | 6/1959 | Koliss ......................... | 174/41 |
| 4,462,317 A | * | 7/1984 | Franko et al. ................. | 70/63 |
| 4,723,053 A | * | 2/1988 | Amaya ......................... | 174/41 |
| 5,323,454 A | * | 6/1994 | Shay et al. .................. | 361/600 |
| 5,555,752 A | * | 9/1996 | Fitzpatrick ................... | 70/159 |
| 5,789,828 A | * | 8/1998 | Tremaine et al. ........... | 361/610 |
| 5,892,653 A | * | 4/1999 | Nishimuta et al. .......... | 361/643 |
| 6,067,441 A | * | 5/2000 | Pan ............................. | 725/150 |
| 6,072,981 A | * | 6/2000 | Inoue ........................ | 174/35 R |
| 6,337,438 B1 | * | 1/2002 | Oyamada ................... | 174/52.1 |
| 6,646,200 B1 | * | 11/2003 | White et al. .................. | 174/41 |

* cited by examiner

*Primary Examiner*—Dean A. Reichard
*Assistant Examiner*—Adolfo Nino
(74) *Attorney, Agent, or Firm*—Norman Friedland

(57) ABSTRACT

A security apparatus for enclosing the branch connections of a cable-TV aerial tap unit to prevent unauthorized used thereof including a box like structure mounted on the bottom of the tap unit to enclose the cables and connections thereof and providing a keyed hinged door to allow access to the interior of the box like structure to access the cables and the method of securing the same by providing either a slidable clip or a rotatable clip attached to the box like structure that has an opening that engages the shank of the existing bolt of the tap unit when the bolt is loosened while the bolt head bears against the slidable or rotatable clip to hold the box like structure in place so as to allow the tightening thereof to secure the apparatus in place.

9 Claims, 3 Drawing Sheets

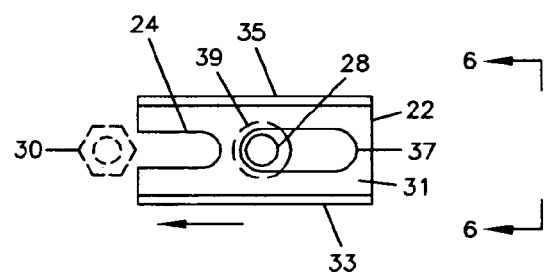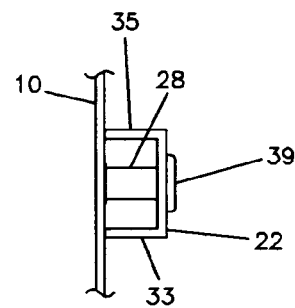
FIGURE 5FIGURE 6
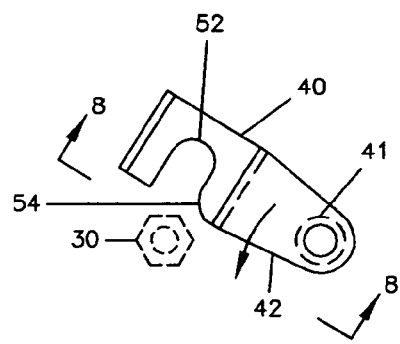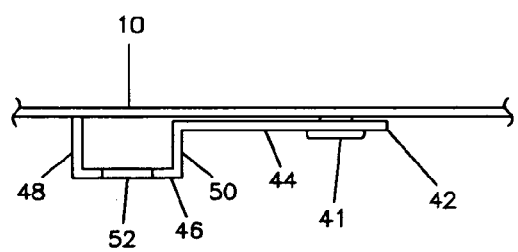
FIGURE 7FIGURE 8

SECURITY APPARATUS AND METHOD

CROSS-REFERENCE TO RELATED APPLICATION

This application claims benefit of a prior filed U.S. Provisional Application, Ser. No. 60/490,044, filed on Jul. 25, 2003.

STATEMENT REGARDING FEDERALLY SPONSORED RESEARCH OR DEVELOPMENT

None

TECHNICAL FIELD

This invention relates to security apparatus and more particularly to a box-like security structure that encloses a cable-tv aerial tap unit to prevent unauthorized personnel from tampering or making connections without permission and the method of installing.

BACKGROUND OF THE INVENTION

As is well known by those skilled in television communication technology, programs are transmitted from a transmitter to the consumer via different means such as satellite, cable, special cable, audio and video waves and the like, and in certain communities the transmissions are done by cable that is routed via telephone, power or other poles to the consumer. This invention is solely concerned with transmissions that utilize aerial tap units that are attached to a cable which, in turn, are mounted on a series of poles. The system includes an overhead signal cables that are routed to the consumer. Obviously, these units which are installed on the cables are equipped with multiple cable branch connections and since the cables are connected to posts which are strung along a route at different intervals that serve customers and the frequency of units are predicated by the density of consumers. The customer cable connections are exposed on the bottom of the tap unit and are unprotected and hence, can be tampered with. Inasmuch as these aerial tap units are mounted on the overhead signal cable that is elevated from the ground, certain individuals found it logical to conclude that the unauthorized connection to transmit the TV signal via the aerial tap units to a non-paying recipient will not occur. Untrue. As has been found out in actual practice, when a consumer left the cable services that consumer would merely re-connect the cable to his home receiver and get the benefit of the cable transmissions without paying the fees. Or, alternatively, if there is an unused tap on the box, the unlawful consumer could merely make the connection.

Inasmuch as the installation of this inventive security apparatus must be done by an installer while being raised to the level of the cable-tv aerial tap unit, the installation must be facilitated such that the security apparatus is not only easy to install, but the connection must be positive while avoiding the potential of it being dropped. In accordance with this invention, a particular method of attachment is provided that allows the installer to temporarily mount the security apparatus on the cable-tv aerial tap unit, loosen the attachment bolt of the tap and then, slide a sliding or rotating clip with a slot that is formed as part of the security apparatus over the shank of the attachment bolt of the tap and then tighten the bolt or, alternatively, provide a connector with an oversized aperture that fits over the bolt head, while the security apparatus is supported to the bolts, alternately remove the bolts, insert a washer and then replace the bolts so as to complete the installation where the security apparatus is properly mounted in place.

It should be noted that there are currently prior art enclosure devices that are used to secure these tap units and they consists of two pieces where one is fitted over the top and the other is fitted over the bottom of the tap unit requiring special bolts and special tools to fasten the two units together. The installation and maintenance is cumbersome, since the bottom has to be removed and stored while the service person works on the unit. Not only does this present the possibility of the bottom from falling, it requires the service person to carry the special tools.

We have found that we can provide a relatively simple, inexpensive, one piece enclosure having locked access doors and the capability of easy installation without requiring special bolts and/or tools.

SUMMARY OF THE INVENTION

An object of this invention is to provide an improved security apparatus for cable-tv aerial tap unit.

A feature of this invention is a box-like structure having an access panel which encases the connection of a cable-tv aerial tap unit and that is characterized as economical to build, easy to install and maintain and requires no special tools for the installation thereof.

Another object of this invention is the method of attaching the security apparatus to encase the connections of a cable-tv aerial tap unit by including a sliding or rotating clip having a U-shaped slot that is apart of the security apparatus and that fits between the existing tap unit bolt head and shank of the bolt when loosened and then tightened to secure the security apparatus in place. Or alternatively, providing an oversized aperture on a connector formed in the security apparatus that fits over the customary bolt heads of the cable-tv aerial tap unit, then loosening the bolts, fitting the security apparatus in place by inserting the bolts into the over sized aperture, sequentially removing each of the bolts while the security unit is being held and inserting a washer that overlies the oversized hole and then tightening each of the bolts.

The foregoing and other features of the present invention will become more apparent from the following description and accompanying drawings.

BRIEF DESCRIPTION OF THE DRAWINGS

FIG. 5 is a fragmentary and exploded view showing the details of the sliding clip of this invention;

FIG. 6 is a partial end view of FIG. 5 absent the bolt;

FIG. 7 is an alternate embodiment of a clip and is a fragmentary and exploded view showing the details of a rotating version of a clip of this invention; and FIG. 8 is an end view of FIG. 7 absent the bolt.

Figure 1:
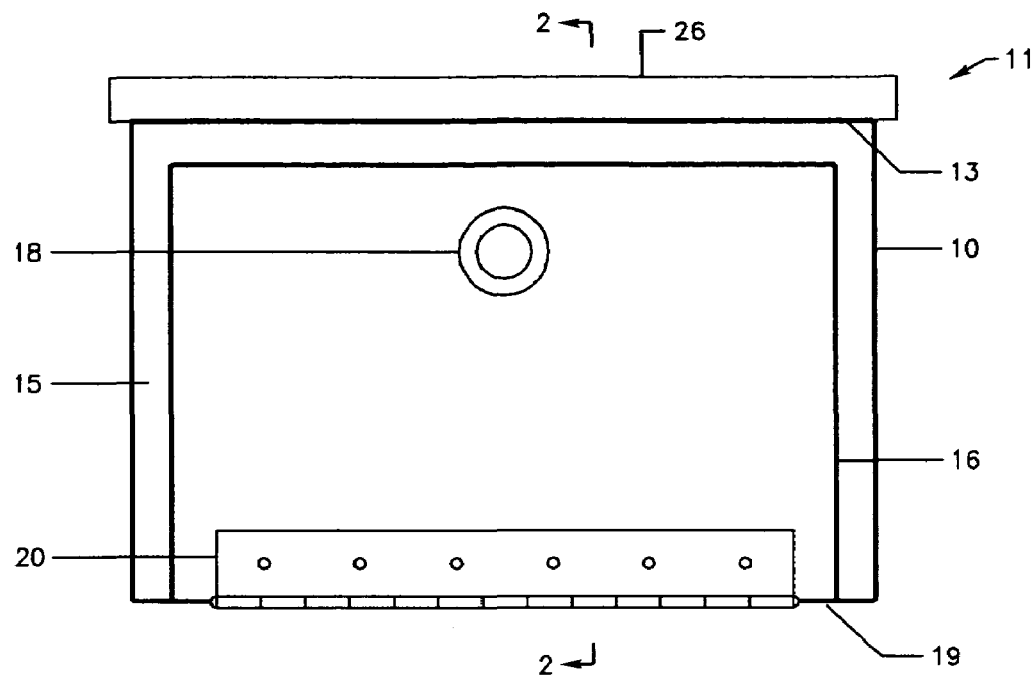
FIG. 1 is a view in elevation illustrating the security apparatus of this the invention mounted to a tap unit.
Figure 2:
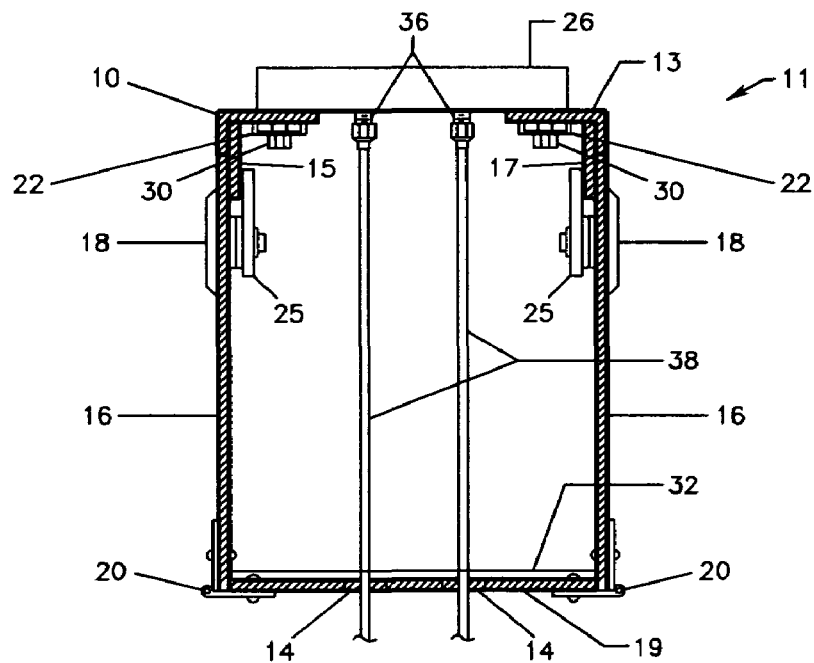
FIG. 2 is a sectional view taken along lines 2—2 of FIG. 1.

These figures merely serve to further clarify and illustrate the present invention and are not intended to limit the scope thereof.

DETAILED DESCRIPTION OF THE INVENTION

While this invention in its preferred embodiment discloses details to fit a particular tap unit and includes opposing doors, it should be understood that as one skilled in the art will appreciate, other configurations for other types of tap units are contemplated by this invention. Suffice it to say that the detail of the invention may be executed differently providing that the unit is a single box-like structure containing internal mounting connectors to connect to the tap unit without having to dismount the tap unit and assuring that the security apparatus can be mounted without the potential of dropping any of the hardware. The material selected for the apparatus is one that is characterized as being reliable to secure the tap unit and may be metal or plastic.

The invention can best be understood by referring to all of the Figs. which illustrate the security apparatus generally illustrated by reference numeral 11 comprising a box-like enclosure 10 having an opened top portion 13, opened opposing side portions 15 and 17, closed by the door panels 16, bottom wall portion 19, and opposing side panels 21 and 23. The door panels 16 (two, but one could be used) are suitably attached to the opposing side panels 15 and 16 by a suitable hinge 20 and may include any well known commercial lock 18 that includes the rotatable locking member 25 that slides relative to the flat surface of the panels 15 and 16.

The tap unit 26 which is suitably suspended from a signal cable, is disclosed as a blank box and the details thereof are omitted herefrom for the sake of simplicity inasmuch as these units are not considered part of this invention and are well known. The plurality of branch cables 38 that are attached to the cable connectors 36 on the bottom of the tap unit 26 are routed through the rectangular opening 39 through the interior of the box-like enclosure 10 and pass through openings 14 formed on the bottom wall 19. A flexible insect barrier gasket 32 made from a suitable commercially available material is attached to the inner surface of the bottom portion 19 and is formed with suitable slits 34 that overlie the holes 14 so as to allow the passage of the cables 38 while sealing the holes that do not carry the cables. This assures that insects do not enter the interior of the security apparatus 11.

Figure 3:
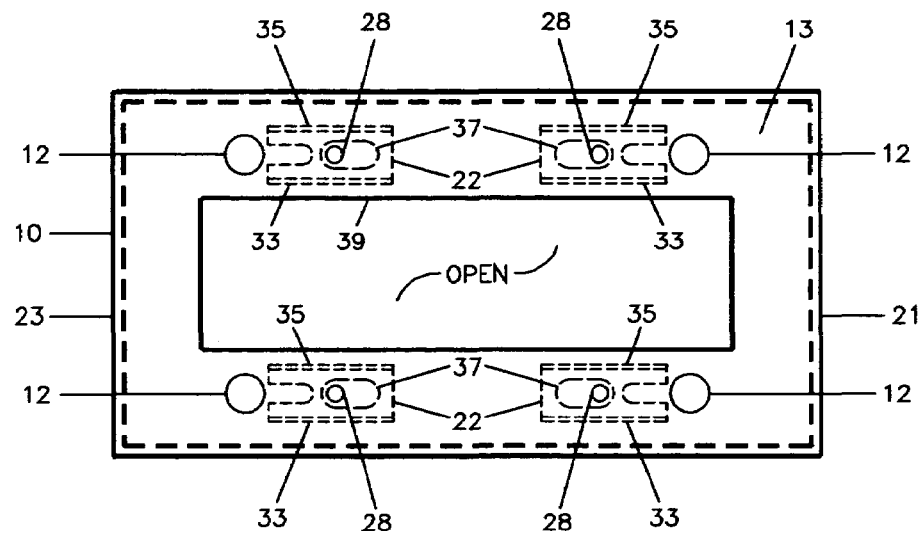
FIG. 3 is a top plan view illustrating the connection clips mounted in the security apparatus of this invention.
Figure 4:
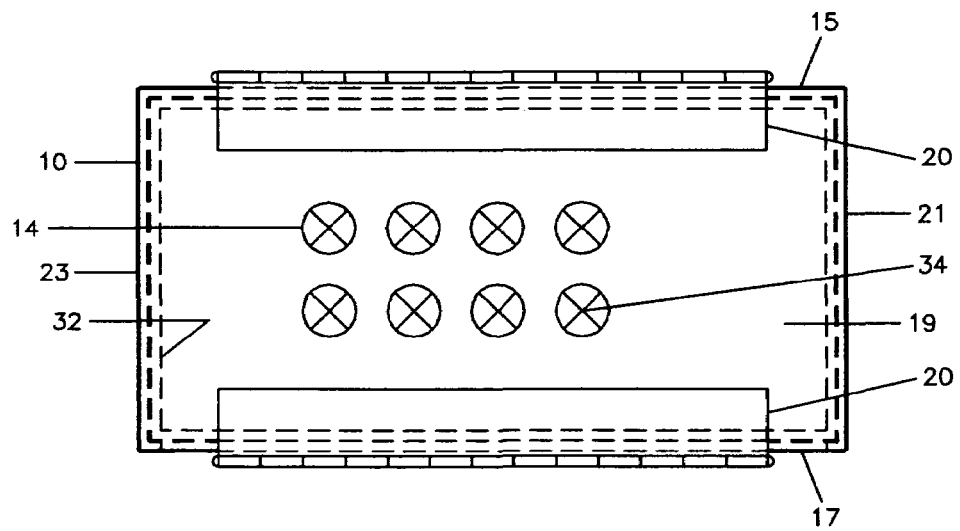
FIG. 4 is a plan bottom view illustrating the openings for passing the cables from the tap unit through the security apparatus of this invention.

FIGS. 3, 5 and 6 illustrate the sliding clip 22 that attaches to the original bolts of the tap unit 26. The diameter of each of the holes 12 is larger than the diameter of each of the heads of the tap unit bolts 30 so that when installing the security apparatus the holes fit over the heads of the tap unit bolts 30. The sliding clip 22 comprises a flat planar portion 31 and depending side members 33 and 35 that define the space over the bolt of the tap unit. The pin 28 with the head 39 loosely fits into slot 37 allowing the sliding clip 22 to move rectilinearly relative to the top portion 13. The end of the planar portion 31 carries the U-shaped slot 24 which is wider in diameter than the shank of bolt 30 but smaller in diameter than the head of bolt 30. Hence, by loosening bolt 30 the sliding clip 22 slides over the shank of bolt 30, the bolt is then tightened down to secure the security apparatus in place. Obviously, the installation is relatively simple, requires no special tools and assure that none of the hardware can become dislodged and fall.

FIGS. 7 and 8 exemplify another connector that replaces the sliding clip 22. These Figs. Illustrate a rotating clip that is pinned by pin 41 to the top portion 13 of the enclosure 10 so as to define a pivot to rotate the rotating clip 40. Rotating clip 40 comprises a main body 42 having a lower planar portion 44 and an upper planar portion 46. Depending walls 48 and 50 are dimensioned to extend beyond the bolt 30. A slot 52 is formed on the side of the upper planar portion 46 and engages the shank of bolt 30 as was explained in connection with the embodiment depicted in FIGS. 3, 5 and 6. The edge 54 may be beveled in order to allow the ease of rotating the rotating clip into the shank of bolt 30. Once inserted, the previously loosened bolt 30 is then tightened to secure the security apparatus in place.

Another method of attaching the security apparatus to the unit is to provide holes complementing the bolt on the top wall of the box like structure. The diameter of these holes are made larger than the diameter of the head of the bolt of the tap unit. The bolts are then loosened and the holes are slid over the head of the bolts. The box like structure is then moved slightly so that the edge of the holes overlie the portion of the head of the bolt. This will hold the box like structure in place. Each of the bolts are then removed one at a time or in sequence. Once removed a washer whose inside diameter is smaller than the diameter of the head is inserted over the shank and the bolt is then replaced so that the washer secures the box like structure once the bolt is tightened.

Although this invention has been shown and described with respect to detailed embodiments thereof, it will be appreciated and understood by those skilled in the art that various changes in form and detail thereof may be made without departing from the spirit and scope of the claimed invention.

It is claimed:

1. A security apparatus for an aerial tap unit, said aerial tap unit including supporting bolts and each of said bolts having a shank and a head, said security apparatus comprising a box like structure having a top portion, a bottom portion and opposing side walls, said top portion adapted to be connected to the bottom of the tap unit and defining an enclosure therefor and including an opening to allow the passage of cables of the aerial tap unit to be routed through the box like structure through openings formed in the bottom portion, at least one of said side walls having an access opening into the interior of said box like structure to allow access to said cables, a first door hingedly mounted on said opened side wall and lock means to lock said door into place, a slidable clip attached to the interior of said box like structure and adapted to slide relative to said bolt and having an opening for engaging the shank of said bolt and being smaller in diameter than the diameter of the head of said bolt to secure said box like structure to said aerial tap unit.

2. A security apparatus for an aerial tap unit as claimed in claim 1 wherein the other opposing side wall includes an access opening and a second door hingedly connected to said other opposing side wall.

3. A security apparatus for an aerial tap unit as claimed in claim 1 wherein said slidable clip includes a planar member and opposing side depending members dimensioned to span the depth of said bolt head, a slot formed in said planar member and a pin mounted in said slot to provide limited rectilinear motion to said sliding clip.

4. A security apparatus for an aerial tap unit, said aerial tap unit including supporting bolts and each of said bolts having a shank and a head, said security apparatus comprising a box like structure having a top portion, a bottom portion and opposing side walls, said top portion adapted to be connected to the bottom of the tap unit and defining an enclosure therefor and including an opening to allow the passage of the cables of the aerial tap unit to be routed through the box like structure through openings formed in the bottom portion, at least one of said side walls having an access opening into the interior of said box like structure to allow access to said cables, a first door hingedly mounted on said opened side wall and lock means to lock said door into place, rotating clip attached to the interior of said box like structure and adapted to rotate relative to said bolt and having an opening for engaging the shank of said bolt and being smaller in diameter than the diameter of the head of said bolt to secure said box like structure to said aerial tap unit.

5. A security apparatus for an aerial tap unit as claimed in claim 4 wherein the other opposing side wall includes an access opening and a second door hingedly connected to said other opposing side wall.

6. A security apparatus for an aerial tap unit as claimed in claim 4 wherein said rotating clip includes a lower planar member, an upper planar member and opposing side depending members extending from said upper planar member and being dimensioned to span the depth of said bolt head, a slot formed in said upper planar member and a pin mounted in said lower planar member and attached to said box like structure and defining a pivot to rotate said rotating clip to allow said slot to engage the shank of said bolt.

7. A security apparatus for an aerial tap unit as claimed in claim 6 including a beveled edge formed at one end of said slot to allow the passage of said rotating clip relative to said shank.

8. The method of installing a security apparatus to an aerial tap unit of the type that includes a bolt to allow secured access to the cables of the aerial tap unit comprising the steps of:

providing a box like structure enclosing the bottom of said aerial tap unit including an access panel to access the cables of the aerial tap unit;

providing a sliding clip slidable relative to the inner surface of the box like structure that includes an opening that engages the shank of the bolt but is dimensioned smaller than the head of the bolt;

loosening the bolt of the aerial tap unit and sliding the sliding clip to engage the shank of the bolt; and tightening the bolt to secure the security apparatus to the aerial tap unit.

9. The method of installing a security apparatus to an aerial tap unit of the type that includes a bolt to allow secured access to the cables of the aerial tap unit comprising the steps of:

providing a box like structure enclosing the bottom of said aerial tap unit including an access panel to access the cables of the aerial tap unit;

providing a rotating clip rotatable relative to the inner surface of the box like structure that includes an opening that engages the shank of the bolt but is dimensioned smaller than the head of the bolt;

loosening the bolt of the aerial tap unit and rotating the rotating clip to engage the shank of the bolt; and tightening the bolt to secure the security apparatus to the aerial tap unit.

* * * * *